United States Patent
Cho et al.

(10) Patent No.: US 12,166,151 B2
(45) Date of Patent: Dec. 10, 2024

(54) LIGHT-EMITTING DEVICE AND DISPLAY DEVICE HAVING THE SAME

(71) Applicant: EPISTAR CORPORATION, Hsinchu (TW)

(72) Inventors: Heng-Ying Cho, Hsinchu (TW); Li-Yu Shen, Hsinchu (TW); Yu-Yi Hung, Hsinchu (TW); Chen Ou, Hsinchu (TW); Li-Ming Chang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 493 days.

(21) Appl. No.: 17/389,467

(22) Filed: Jul. 30, 2021

(65) Prior Publication Data

US 2022/0037556 A1 Feb. 3, 2022

(30) Foreign Application Priority Data

Jul. 31, 2020 (TW) .................................. 109126046
May 14, 2021 (TW) .................................. 110117551

(51) Int. Cl.
*H01L 33/10* (2010.01)
*H01L 27/15* (2006.01)
*H01L 33/20* (2010.01)
*H01L 33/38* (2010.01)

(52) U.S. Cl.
CPC ............ *H01L 33/20* (2013.01); *H01L 27/156* (2013.01); *H01L 33/10* (2013.01); *H01L 33/382* (2013.01)

(58) Field of Classification Search
CPC ....... H01L 27/156; H01L 33/20; H01L 33/10; H01L 33/382; H01L 33/44; H01L 33/48; H01L 33/58; H01L 33/60; F21K 9/68
See application file for complete search history.

(56) References Cited

U.S. PATENT DOCUMENTS

| 2010/0084678 A1* | 4/2010 | Streubel | H01L 33/50 |
| | | | 257/E33.068 |
| 2016/0349445 A1* | 12/2016 | Kim | H01L 33/56 |
| 2016/0351764 A1* | 12/2016 | Cha | H01L 33/505 |
| 2019/0189850 A1* | 6/2019 | Wang | H01L 33/32 |

FOREIGN PATENT DOCUMENTS

| CN | 106486587 B | 11/2018 |
| TW | 201826516 A | 7/2018 |

\* cited by examiner

*Primary Examiner* — Farun Lu
*Assistant Examiner* — Sandra Milena Rodriguez Villan
(74) *Attorney, Agent, or Firm* — Patterson + Sheridan, LLP

(57) ABSTRACT

A light-emitting device, including: a semiconductor stack generating a first light; and a filter formed on the semiconductor stack, including a first surface facing the semiconductor stack and a second surface opposite to the first surface; and a transparent conductive layer formed on the semiconductor stack; wherein: the filter includes a plurality of first dielectric layers with a first refractive index and a plurality of second dielectric layers with a second refractive index alternately stacked, a portion of the first light is transmitted by the filter and extracted from the second surface, the light-emitting device has a beam angle in a range of 50 degrees to 110 degrees, and the filter comprises a light transmittance of more than 90% with respect to light incident at an incident angle in a range less than 10 degrees.

15 Claims, 9 Drawing Sheets

LIGHT-EMITTING DEVICE AND DISPLAY DEVICE HAVING THE SAME

CROSS-REFERENCE TO RELATED APPLICATIONS

This application claims priority to the benefit of Taiwan Patent Application Number 109126046 filed on Jul. 31, 2020 and Taiwan Patent Application Number 110117551 filed on May 14, 2021, and the entire contents of which are hereby incorporated by reference herein in its entirety.

BACKGROUND

Technical Field

The present application relates to a light-emitting device and a display device having the same, more specifically, to a light-emitting device having a filter.

Description of the Related Art

The light-emitting diode devices of solid-state lighting device have the characteristics of low power consumption, low heat-generation, long lifetime, compact size, high response speed and stable emission wavelength. Thus, the light-emitting diode devices have been widely used in lighting and display device. For example, the display device with the light-emitting devices as the pixels can replace the conventional liquid crystal display device and achieve a high-quality display effect. While the light-emitting device is applied to a display device, how to keep the photoelectric characteristics thereof and improve the display quality of the display device concerns people in the present technology field.

SUMMARY

A light-emitting device, including: a semiconductor stack generating a first light; and a filter formed on the semiconductor stack, including a first surface facing the semiconductor stack and a second surface opposite to the first surface, wherein the filter includes a plurality of pairs of layers with different refractive indexes alternately stacked, and wherein a portion of the first light is transmitted by the filter; wherein: the light emitting device emits a second light including the portion of the first light, and the second light includes a first directional part with a first FWHM and a second directional part with a second FWHM, wherein the first directional part having a first angle with a normal direction of the second surface in a range of 45-90 degrees and the second directional part having a second angle with the normal direction of the second surface in a range of 0-30 degrees, and the second FWHM is smaller than the first FWHM.

A light-emitting device, including: a semiconductor stack generating a first light; and a filter formed on the semiconductor stack, including a first surface facing the semiconductor stack and a second surface opposite to the first surface, wherein the filter includes a plurality of pairs of layers with different refractive indexes alternately stacked; wherein: a portion of the first light is transmitted by the filter; the light emitting device emits a second light including the portion of the first light; the first light has a first FWHM and the second light has a second FWHM; and the second FWHM is smaller than the first FWHM, and/or the second light has a FWHM less than or equal to 25 nm.

A light-emitting device, including: a semiconductor stack generating a first light; a filter formed on the semiconductor stack, including a first surface facing the semiconductor stack and a second surface opposite to the first surface; and a transparent conductive layer formed on the semiconductor stack; wherein: the filter includes a first dielectric layer and a second dielectric layer alternately stacked; the first surface contacts the transparent conductive layer; a portion of the first light is transmitted by the filter; and the light-emitting device has a beam angle in a range of 50 degrees to 110 degrees.

DETAILED DESCRIPTION OF THE EMBODIMENTS

To better and concisely explain the disclosure, the same name or the same reference number given or appeared in different paragraphs or figures along the specification should has the same or equivalent meanings while it is once defined anywhere of the disclosure.

Figure 1:
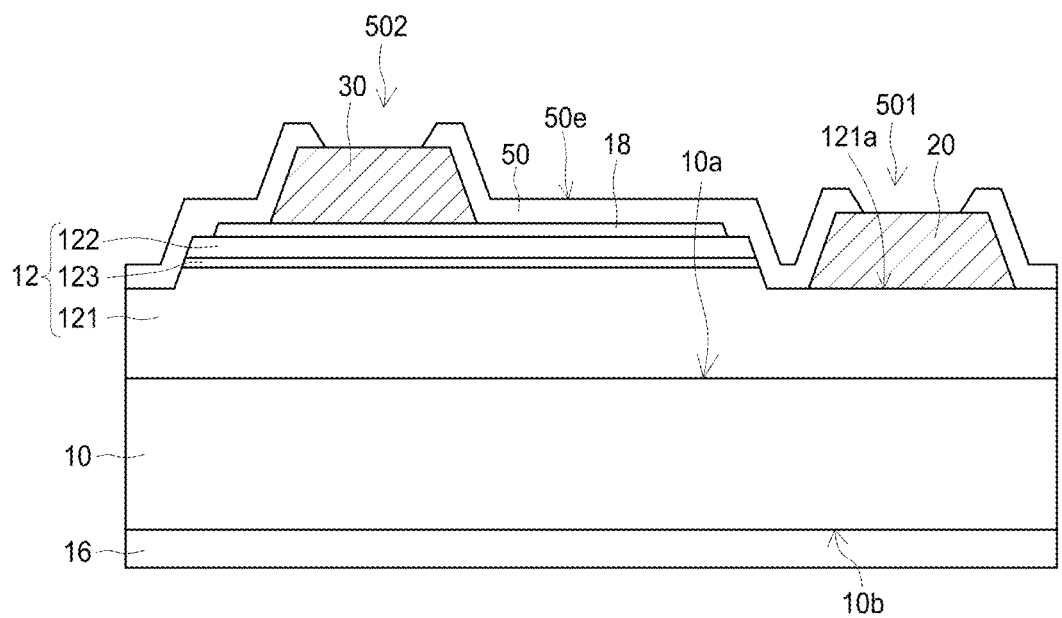
FIG. 1 shows a light-emitting device 1 in accordance with a first embodiment of the present application.

FIG. 1 shows a cross-sectional view of a light-emitting device 1 in accordance with a first embodiment of the present application. As shown in FIG. 1, the light-emitting device 1 includes a substrate 10, and a semiconductor stack 12 formed on a first surface 10a of the substrate 10. The semiconductor stack 12 includes a first semiconductor layer 121, an active region 123 and a second semiconductor layer 122 sequentially formed on the first surface 10a. The first semiconductor layer 121 includes a first surface 121a that is not covered by the active region 123 and the second semiconductor layer 122. A transparent conductive layer 18 is formed on the second semiconductor layer 122. A first electrode 20 is formed on the first surface 121a of the first semiconductor layer and a second electrode 30 is formed on the transparent conductive layer 18. A filter 50 is formed on the semiconductor stack 12. A reflective structure 16 is formed on a second surface 10b of the substrate 10 opposite to the first surface 10a.

The substrate 10 can be a growth substrate for growing semiconductor layers thereon. The substrate 10 includes GaAs or GaP for growing AlGaInP based semiconductor thereon. The substrate 10 includes sapphire, GaN, SiC or AlN for growing AlGaInN based semiconductor such as GaN, InGaN or AlGaN thereon. The substrate 10 can be a patterned substrate; that is, the substrate 10 includes a plurality of patterned structures (not shown) on the first surface 10a. In one embodiment, the light generated from the semiconductor stack 12 is refracted by the patterned structures, thereby increasing the brightness of the light-emitting device. In addition, the patterned structures lessen or suppress the dislocation by lattice mismatch between the substrate 10 and the semiconductor stack 12, thereby improving the epitaxy quality of the semiconductor stack 12.

In an embodiment of the present application, the semiconductor stack 12 is formed on the substrate 10 by metal-organic chemical vapor deposition (MOCVD), molecular beam epitaxy (MBE), hydride vapor epitaxy (HVPE) or ion plating such as sputtering or evaporating.

The semiconductor stack 12 further includes a buffer structure (not shown) between the first semiconductor layer 121 and the substrate 10. The buffer structure, the first semiconductor layer 121, the active region 123 and the second semiconductor layer 122 constitute the semiconductor stack 12. The buffer structure reduces the lattice mismatch and suppresses dislocation so as to improve the epitaxy quality. The material of the buffer structure includes GaN, AlGaN, or AlN. In an embodiment, the buffer structure includes a plurality of sub-layers (not shown) and the sub-layers include the same materials or different materials. In one embodiment, the buffer structure includes two sub-layers wherein a first sub-layer thereof is grown by sputtering and a second sub-layer thereof is grown by MOCVD. In another embodiment, the buffer structure further includes a third sub-layer. The third sub-layer is grown by MOCVD, and the growth temperature of the second sub-layer is higher or lower than the growth temperature of the third sub-layer. In an embodiment, the first, second, and third sub-layers include the same material, such as AlN. In one embodiment, the first semiconductor layer 121 and the second semiconductor layer 122 are, for example, cladding layers or confinement layers. The first semiconductor layer 121 and the second semiconductor layer 122 have different conductivity types, different electrical properties, different polarities or different dopants for providing electrons or holes. For example, the first semiconductor layer 121 is composed of n-type semiconductor and the second semiconductor layer 122 is composed of p-type semiconductor. The active region 123 is formed between the first semiconductor layer 121 and the second semiconductor layer 122. When being driven by a current, electrons and holes are combined in the active region 123 to convert electrical energy into optical energy for illumination. The wavelength of the light generated by the light-emitting device 1 or by the semiconductor stack 12 can be adjusted by changing the physical properties and chemical composition of one or more layers in the semiconductor stack 12.

The material of the semiconductor stack 12 includes III-V semiconductor with $Al_xIn_yGa_{(1-x-y)}N$ or $Al_xIn_yGa_{(1-x-y)}P$, where $0 \leq x, y \leq 1; x+y \leq 1$. When the material of the semiconductor stack 12 includes AlInGaP, the semiconductor stack 12 emits red light having a wavelength between 570 nm and 780 nm or yellow light having a wavelength between 550 nm and 570 nm. When the material of the semiconductor stack 12 includes InGaN, the semiconductor stack 12 emits blue light or deep blue light having a wavelength between 380 nm and 490 nm or green light having a wavelength between 490 nm and 550 nm. The active region 123 can be a single hetero-structure (SH), a double hetero-structure (DH), a double-side double hetero-structure (DDH), or a multi-quantum well (MQW) structure. The material of the active region 123 can be i-type, p-type or n-type semiconductor.

The transparent conductive layer 18 electrically contacts the second semiconductor layer 122 for laterally spreading current. In another embodiment, the transparent conductive layer 18 includes an opening (not shown) located under the second electrode 30, exposing the second semiconductor layer 122, and the second electrode 30 contacts the second semiconductor layer 122 through the opening of the transparent conductive layer 18. The transparent conductive layer 18 can be metal or transparent conductive material. The metal material forms a thin metal layer having light transparency. The transparent conductive material is transparent to the light emitted from the active region 123, such as graphene, indium tin oxide (ITO), zinc aluminum oxide (AZO), gallium zinc oxide (GZO), zinc oxide (ZnO) or indium zinc oxide (IZO).

The first electrode 20 is located on the first surface 121a and is electrically connected to the first semiconductor layer 121. The second electrode 30 is electrically connected to the second semiconductor layer 122. The first electrode 20 and the second electrode 30 each includes a pad electrode. FIG. 1 exemplarily shows the pad electrodes of the first electrode 20 and the second electrode 30. In another embodiment, the first electrode 20 and/or the second electrode 30 further include finger electrodes (not shown) extending from the pad electrode. The pad electrodes of the first electrode 20 and the second electrode 30 are used for wire bonding or soldering bonding to electrically connect the light-emitting device 1 with an external power source or external electronic components. The materials of the first electrode 20 and the second electrode 30 include metals, such as Cr, Ti, Au, Al, Cu, Sn, Ni, Rh, W, In, Pt, an alloy or a laminated stack of the above materials.

In one embodiment, the light-emitting device 1 further includes a current blocking layer (not shown) located between the transparent conductive layer 18 and the second semiconductor layer 122, and/or located between the first electrode 20 and the first semiconductor layer 121.

The filter 50 includes openings 501 and 502. In the present embodiment shown in FIG. 1, the filter 50 covers the semiconductor stack 12, the transparent conductive layer 18, and parts of the first electrode 20 and the second electrode 30. Besides, the filter 50 exposes the first electrode 20 and the second electrode 30 through the openings 501 and 502 respectively. To be more specific, the first electrode 20 and the second electrode 30 are exposed by the filter 50. In another embodiment (not shown), the filter 50 does not cover the first electrode 20 and the second electrode 30. In another embodiment (not shown), the filter 50 covers the semiconductor stack 12 and the transparent conductive layer 18. The filter 50 further extends under a part of the first electrode 20 and a part of the second electrode 30. The first electrode 20 and the second electrode 30 are electrically connected to the semiconductor stack 12 through the openings 501 and 502, respectively.

The filter 50 is formed by alternately stacking a pair or a plurality of pairs of layers with different refractive indexes. The light extraction surface is the surface 50e of the filter 50 away from the semiconductor stack 12. Lights within a specified wavelength range can transmit the filter 50. When the light-emitting device 1 emits light of a single color, a portion of the light within a specified wavelength range can be blocked by the filter 50 so that the single color light emitted by the light-emitting device 1 can be purified. In one embodiment, the filter 50 can act as a protective structure as well. The protective structure protects the light-emitting device, such as preventing moisture from penetrating the light-emitting device. In one embodiment, by selecting dielectric materials with different refractive index and the thickness thereof, the light emitted by the semiconductor stack can selectively transmit through the filter 50 or be reflected by the filter 50, and only a portion of the light within a specified wavelength range can pass the filter 50. As a result, light filtering can be realized. In an embodiment, the filter 50 can be a band-pass filter, a low-pass filter function, or a high-pass filter.

Figure 2A:
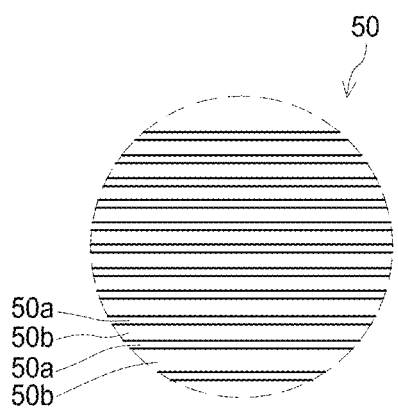
FIGS. 2A and 2B show partially enlarged views of cross-sections of a filter of the light-emitting device in accordance with an embodiment of the present application.

FIG. 2A shows a partially enlarged view of a cross-section of the filter 50. In the embodiment shown in FIG. 2A, the filter 50 includes a first group of layers which is composed of a first sub-layer 50a and a second sub-layer 50b. The first group of layers includes dielectric materials and the first sub-layer 50a and the second sub-layer 50b constitute a pair of dielectric layer. The first sub-layer 50a has a refractive index higher than that of the second sub-layer 50b. By selecting dielectric materials with different refractive index and the thicknesses thereof, the filter 50 can block the light within a pre-defined wavelength range. In one embodiment, the first sub-layer 50a has a smaller thickness than the second sub-layer 50b. The dielectric material includes silicon oxide, silicon nitride, silicon oxynitride, niobium oxide, hafnium oxide, titanium oxide, magnesium fluoride, or aluminum oxide. In one embodiment, the filter 50 includes a distributed Bragg reflector.

In another embodiment, the filter 50 further includes additional layers other than the first sub-layer 50a and the second sub-layer 50b. For example, the filter 50 further includes a bottom layer (not shown) between the first sub-layer 50a (and/or the second sub-layer 50b) and the semiconductor stack 12. In other words, the bottom layer is formed on the semiconductor stack 12 first, and then the first sub-layers 50a and the second sub-layers 50b are formed. In one embodiment, the bottom layer includes dielectric material and the thickness thereof is greater than those of the first sub-layer 50a and the second sub-layer 50b. In one embodiment, the bottom layer can be formed by a process different from that for forming the first sub-layer 50a and the second sub-layer 50b. For example, the bottom layer is formed by chemical vapor deposition (CVD), and preferably, formed by plasma enhanced chemical vapor deposition (PECVD). The first sub-layers 50a and the second sub-layers 50b are formed by sputtering. In one embodiment, the bottom layer can protect the light-emitting device or the semiconductor stack. For example, the bottom layer prevents moisture from penetrating the light-emitting device.

Figure 2B:
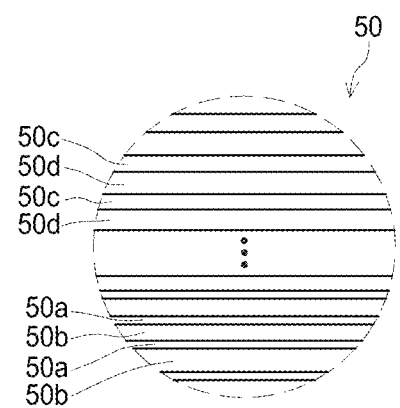

In another embodiment shown in FIG. 2B, the filter 50 includes a plurality of groups of layers. The first group of the layers is composed of the first sub-layer 50a and second sub-layer 50b. The second group of the layers is composed of a third sub-layer 50c and a fourth sub-layer 50d alternately stacked. The third sub-layer 50c and the fourth sub-layer 50d constitute a pair of dielectric layer. The third sub-layer 50c has a higher refractive index than that of the fourth sub-layer 50d. In one embodiment, the third sub-layer 50c has a smaller thickness than that of the fourth sub-layer 50d. The third sub-layer 50c and the first sub-layer 50a have different thicknesses, and the third sub-layer 50c and the first sub-layer 50a are the same material or different materials. The fourth sub-layer 50d and the second sub-layer 50b have different thicknesses, and the fourth sub-layer 50d and the second sub-layer 50b are the same material or different materials.

In another embodiment, the filter 50 further includes a top layer (not shown) on the first sub-layer 50a (and/or the second sub-layer 50b). In other words, the first sub-layers 50a and the second sub-layers 50b are formed on the semiconductor stack 12 first, and then the top layer is formed. The thickness of the top layer is greater than the thicknesses of the first sub-layer 50a and the second sub-layer 50b. In one embodiment, the top layer can be formed by a process different from that for forming the first sub-layer 50a and the second sub-layer 50b. For example, the top layer is formed by chemical vapor deposition (CVD), and preferably, formed by plasma enhanced chemical vapor deposition (PECVD). The first sub-layers 50a and the second sub-layers 50b are formed by sputtering. In one embodiment, the top layer can improve the robustness of the filter 50. For example, when the filter 50 is subject to an external force, the top layer can prevent the filter 50 from being broken and damaged due to the external force.

In another embodiment, the filter 50 includes the plurality of groups of the layers and the bottom layer and/or the top layer.

In another embodiment, before forming the filter 50, a uniform dense layer (not shown) is formed on the surface of the transparent conductive layer 18 and the semiconductor stack 20 by atomic deposition to directly cover the semiconductor stack 12. The material of the dense layer includes silicon oxide, aluminum oxide, hafnium oxide, tantalum oxide, zirconium oxide, yttrium oxide, lanthanum oxide, silicon nitride, aluminum nitride, or silicon oxynitride. In the present embodiment, the interface between the dense layer and the semiconductor stack 12 or the interface between the dense layer and transparent conductive layer 18 includes metal elements and oxygen, where the metal elements include aluminum, hafnium, tantalum, zirconium, yttrium, or lanthanum. The dense layer has a thickness between 50 Å and 2000 Å, preferably between 100 Å and 1500 Å. In one embodiment, the dense layer can be conformably formed on the semiconductor stack 12. Due to the film quality of the dense layer, the dense layer can protect the semiconductor stack 12, such as preventing moisture from entering the semiconductor stack 12, and can increase the adhesion between the filter 50 and the semiconductor stack 12.

In one embodiment, the filter 50 includes more than or equal to 4 pairs and less than or equal to 30 pairs of the dielectric layers. If the filter 50 includes less than 4 pairs of the dielectric layers, the effect of light filtering may not be significant. If the filter 50 includes more than 30 pairs of the dielectric layers, the production cost increases. In one embodiment, the filter 50 includes 8-20 pairs of the dielectric layers. In one embodiment with the filter 50 used as a low-pass filter, the filter 50 has a transmittance more than 95% for a light with a wavelength of less than $\lambda_{on}$ and less than 5% for a light with a wavelength of greater than $\lambda_{off}$. For a light within the wavelength range between $\lambda_{on}$ and $\lambda_{off}$, depending on the number of the pairs of the dielectric layers of the filter 50, the transmittance dramatically decreases. In one embodiment, the filter 50 includes not smaller than 8 pairs of dielectric layers, the difference between $\lambda_{off}$ and $\lambda_{on}$ can be less than or equal to 31 nm. In another embodiment, the filter 50 includes not smaller than 12 pairs of dielectric layers, the difference between $\lambda_{off}$ and $\lambda_{on}$ can be less than or equal to 11 nm. In other words, the filter 50 includes not smaller than 12 pairs of dielectric layers, which can have a narrow light transition band, thereby achieving effective light filtering and light purification. Due to the filter 50 used as the low-pass filter, the light emitted by the light-emitting device 1 in the wavelength greater than $\lambda_{off}$ can be cut off, thereby achieving light purification. Similarly, in another embodiment with the filter 50 used as a high-pass filter, the filter 50 has a transmittance more than 95% for a light with a wavelength of greater than $\lambda_{on}$ and less than 5% for a light with a wavelength of less than $\lambda_{off}$. In another embodiment with the filter 50 used as a band-pass filter, the filter 50 has a transmittance more than 95% for a light with a wavelength between $\lambda_{on1}$ and $\lambda_{on2}$ and less than 5% for a light with a wavelength of less than $\lambda_{off1}$ and greater than $\lambda_{off1}$, where $\lambda_{off1} < \lambda_{on1} < \lambda_{on2} < \lambda_{off2}$.

The reflective structure 16 is located on the second surface 10b of the substrate 10 and can reflect the light emitted from the semiconductor stack 12. The light is extracted mainly through the upper surface of the light-emitting device 1 (that is, the surface where the filter 50 is located). In one embodiment, the reflective structure 16 includes a metal reflective layer, wherein the metal material can be selected from materials having high reflectivity for the light emitted by the semiconductor stack 12, such as aluminum, silver, and the like. In another embodiment, the reflective structure 16 includes a laminated structure, wherein the laminated structure includes a pair or a plurality of pairs of sublayers with different refractive indexes alternately stacked. The material of each sub-layer of the laminated structure has light transmittance, and can be conductive material or insulating material. The conductive material includes metal oxides such as indium tin oxide (ITO), aluminum zinc oxide (AZO), gallium zinc oxide (GZO), zinc oxide (ZnO), or indium zinc oxide (IZO). The insulating materials include organic materials or inorganic materials, and the inorganic materials include silicone, glass, or dielectric materials. By selecting materials with different refractive indexes and the thicknesses thereof, the reflective structure 16 reflects light in a specified wavelength range. In one embodiment, the reflective structure 16 is, for example, a distributed Bragg reflector (DBR). In another embodiment, the reflective structure 16 includes a dielectric stack and a metal layer (not shown) to form an omnidirectional reflector (ODR). In another embodiment, the reflective structure 16 can be omitted.

The light emitted by the semiconductor stack 12, which defined as a first light, is a single color light, such as a blue light, a green light, a cyan light, a yellow light, or a red light. A portion of the first light passes through the filter 50 to obtain a second light having the same color as the first light. The second light is extracted from the upper surface of the light-emitting device 1 and has a full width at half maximum (FWHM) smaller than that of the first light. In one embodiment, the second light obtained through the filter 50 has the same color as the first light, and the peak wavelength thereof is the same as or similar to the peak wavelength of the first light. In another embodiment, the wavelength of the first light overlaps the wavelength of the second light, and the second light has a FWHM smaller than that of the first light. In one embodiment, a portion of the first light emitted by the semiconductor stack 12 extracted from the upper surface through the filter 50 becomes the second light; the other portion of the first light is unfiltered by the filter 50 and extracted from the side surface of the light-emitting device 1. The peak wavelength and the FWHM of the other portion of the first light which is extracted from the side surface of the light-emitting device 1 without passing the filter 50 are the same as or similar to the first light. In one embodiment, the filter 50 has a transmittance more than 80% at $\lambda$p nm which is the peak wavelength of the light, and more preferably, has a transmittance of more than 90%. The filter 50 has a transmittance of less than 50% for one portion of the light within a wavelength greater than ($\lambda$p+$\Delta\lambda$) nm and/or has a transmittance of less than 50% for another portion of the light within a wavelength smaller than ($\lambda$p−$\Delta\lambda$) nm. The $\Delta\lambda$ can be determined according to the user's requirements for filtering and the light intensity of the light-emitting device, and the filter 50 can be designed by selecting sub-layer materials with different refractive indexes and thicknesses.

Figure 3:
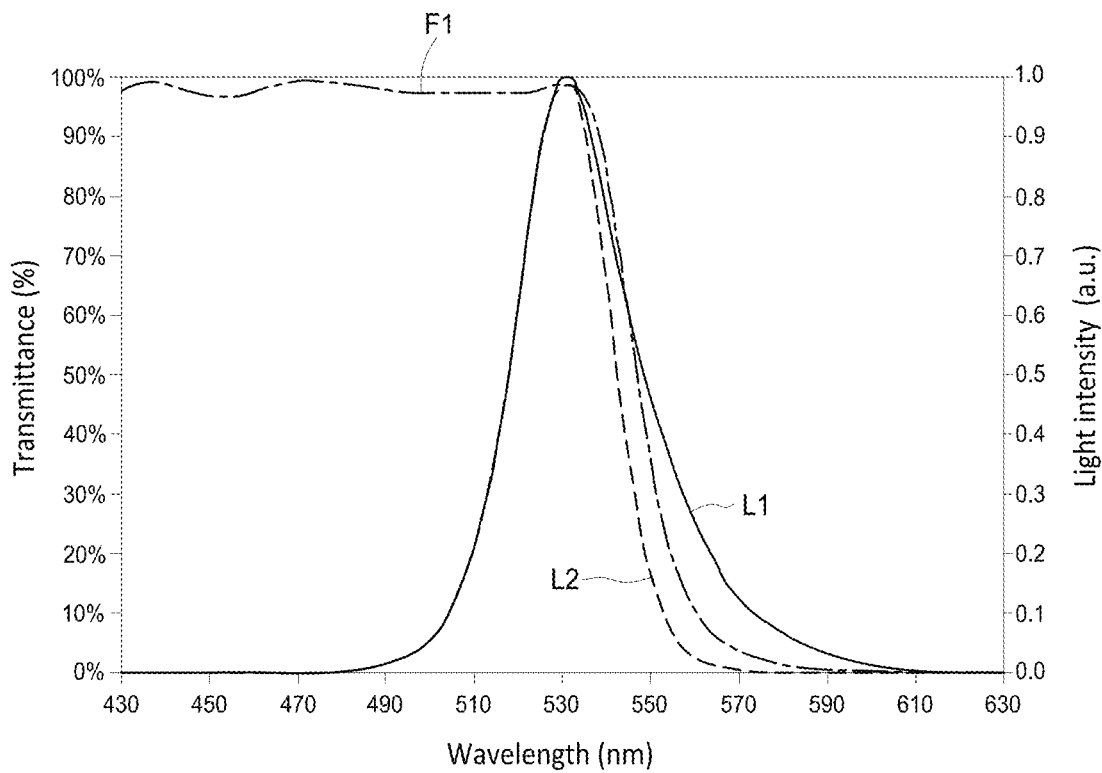
FIG. 3 shows an experiment result in accordance with an embodiment of the present application.

FIG. 3 shows a simulated experiment result in accordance with an embodiment of the present application. In FIG. 3, the curve L1 represents the wavelength spectrum of the light actually emitted from the semiconductor stack 12, which is defined as the first light; the curve F1 represents the transmittance spectrum of the filter 50; and the curve L2 represents the simulated spectrum of the first light after being filtered by the filter 50. That is, the curve L2 is the simulated spectrum of the second light obtained from the first light passing through the filter 50. In this experiment, the first light emitted by the semiconductor stack 12 is green light and has a peak wavelength of 532 nm. The filter 50 includes a plurality of pairs of dielectric layers composed of $SiO_2$ and $TiO_2$, including three groups of the dielectric pairs. The first group of the dielectric pairs is closer to the semiconductor stack 12 and the second group of the dielectric pairs is distant from the semiconductor stack 12. The third group of the dielectric pairs is between the first group of the dielectric pairs and the second group of the dielectric pairs. The optical thicknesses of the $SiO_2$ and $TiO_2$ layers of the first group are greater than the optical thicknesses of the $SiO_2$ and $TiO_2$ layers of the third group. The optical thickness of the $SiO_2$ and $TiO_2$ layers of the second group can be greater than or smaller than the optical thicknesses of the $SiO_2$ and $TiO_2$ layers of the third group. The numbers of the pairs of the first group, the second group and the third group can be integer or non-integer. The non-integer numbers of the pairs of the group indicate that one pair in the group includes only the first layer or the second layer. The number of the dielectric pairs in the third group is larger than the number of dielectric pairs in the first group and the second group. By adjusting the thicknesses of the layers of the first group and the second group, the decrease of the transmittance within some wavelength range caused by interference phenomenon can be reduced.

As shown in FIG. 3, the filter 50 has a transmittance of more than 80% for the peak wavelength; more preferably, the filter 50 has a transmittance of more than 90% at the peak wavelength. The transmittance of the filter 50 is less than 50% for the light with the wavelength more than or equal to 550 nm and greater than or equal to 80% for the light with the wavelength less than or equal to 535 nm. The first light is filtered by the filter 50 to obtain a second light. The second light is also green light but has a FWHM smaller than that of the first light. The filter 50 blocks a portion of the first light in a specified wavelength band. In this experiment, with the low transmittance of the filter for a portion of the first light above 550 nm, the portion of the first light above 550 nm is blocked so that the wavelength spectrum of the second light is more symmetrical than that of the first light. The second light has a FWHM smaller than that of the first light. In an embodiment, the FWHM of the second light is less than or equal to 25 nm. Preferably, the FWHM of the second light is less than or equal to 20 nm. As a result, the color purity of the light emitted by the light-emitting device 1 can be improved.

In another embodiment, the filter 50 acts as a band-pass filter. For a light with a peak wavelength of λp nm, such as a green light with a peak wavelength of 532 nm, the transmittance of the filter is more than 80% at λp nm and less than 50% for the wavelength over 550 nm and under 510 nm. The filter 50 blocks most of the light with a wavelength over 550 nm and under 510 nm.

Figure 4:
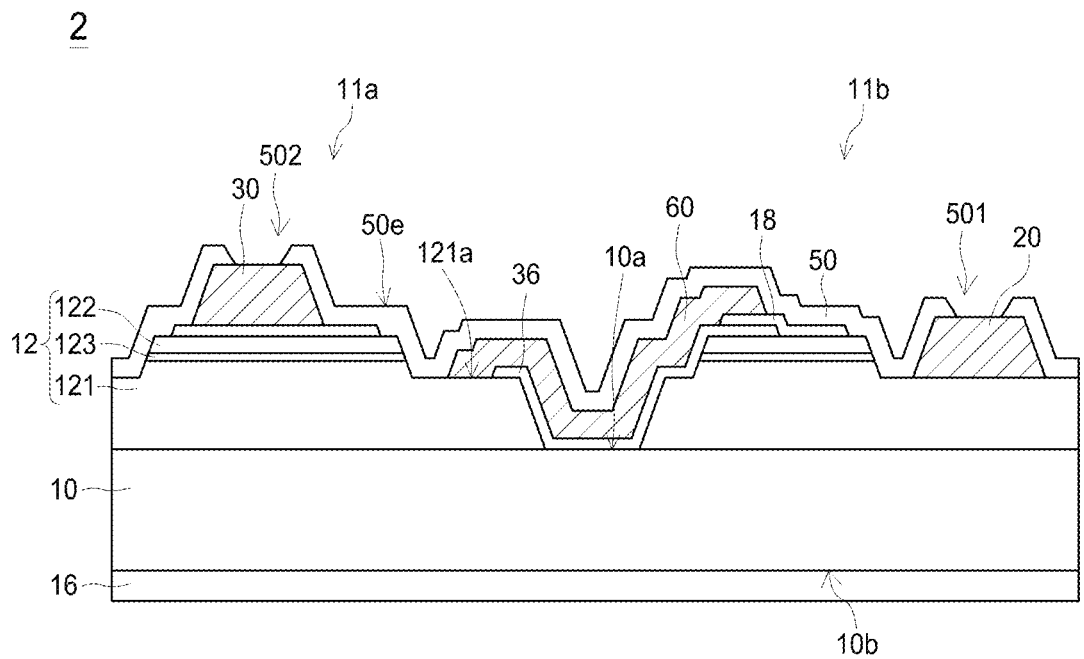
FIG. 4 shows a light-emitting device 2 in accordance with a second embodiment of the present application.

FIG. 4 shows a cross-sectional view of a light-emitting device 2 in accordance with a second embodiment of the present application. The difference from the light-emitting device 1 is that the light-emitting device 2 includes a plurality of light-emitting units electrically connected in series. In the present embodiment, the light-emitting device 2 including two light-emitting units 11a and 11b is taken as an example. The light-emitting units 11a and 11b are separated from each other and are located on the first surface 10a of the substrate 10. The light-emitting units 11a and 11b respectively have a semiconductor stack 12 and a transparent conductive layer 18. An insulating layer 36 is formed between the light-emitting units 11a and 11b and covers the first surface 10a of the substrate 10, the side surface of the first semiconductor layer 121 of the light-emitting unit 11a, the side surface of the semiconductor stack 12 of the light-emitting unit 11b and a portion of the upper surface of the second semiconductor layer 122 of the light-emitting unit 11b. A connecting electrode 60 is formed on the insulating layer 36, one end of which is in contact with the first semiconductor layer 121 of the light emitting unit 11a, and the other end of which is in contact with the transparent conductive layer 18 of the light emitting unit 11b. In this way, the light-emitting units 11a and 11b are electrically connected in series. In another embodiment, the connecting electrode 60 is electrically connected to the first semiconductor layers 121 of the light-emitting units 11a and 11b and/or electrically connected to the second semiconductor layers 122 of the light-emitting units 11a and 11b so that the light-emitting units 11a and 11b form different light-emitting arrays such as in parallel, in series or in series-parallel.

The first electrode 20 is located on the first semiconductor layer 121 of the light-emitting unit 11b and the second electrode 30 is located on the second semiconductor layer 122 of the light emitting-unit 11a. The filter 50 covers the light-emitting units 11a and 11b, the connection electrode 60, and the first surface 10a of the substrate 10 between the light-emitting units 11a and 11b. Similar to the light-emitting device 1 of the first embodiment, the filter 50 of the light-emitting device 2 has openings 501 and 502 exposing the first electrode 20 and the second electrode 30, respectively. The function, structure, and material of the filter 50 of the light-emitting device 2 are the same as described in the above embodiments, and not repeated here. The light extraction surface is the surface 50e of the filter 50 away from the semiconductor stack 12. A portion of the first light emitted by the semiconductor stack 12 in the light-emitting device 2 passes through the filter 50 to obtain the second light, and is extracted from the upper surface (i.e., the surface where the filter 50 is located) of the light-emitting device 2. The second light has the same color as the first light and has a FWHM smaller than that of the first light. In this way, the color purity of the light emitted by the light-emitting device 2 can be improved. In one embodiment, the second light is green light, and the FWHM thereof is less than or equal to 25 nm. Preferably, the FWHM of the second light is less than or equal to 20 nm.

Figure 5:
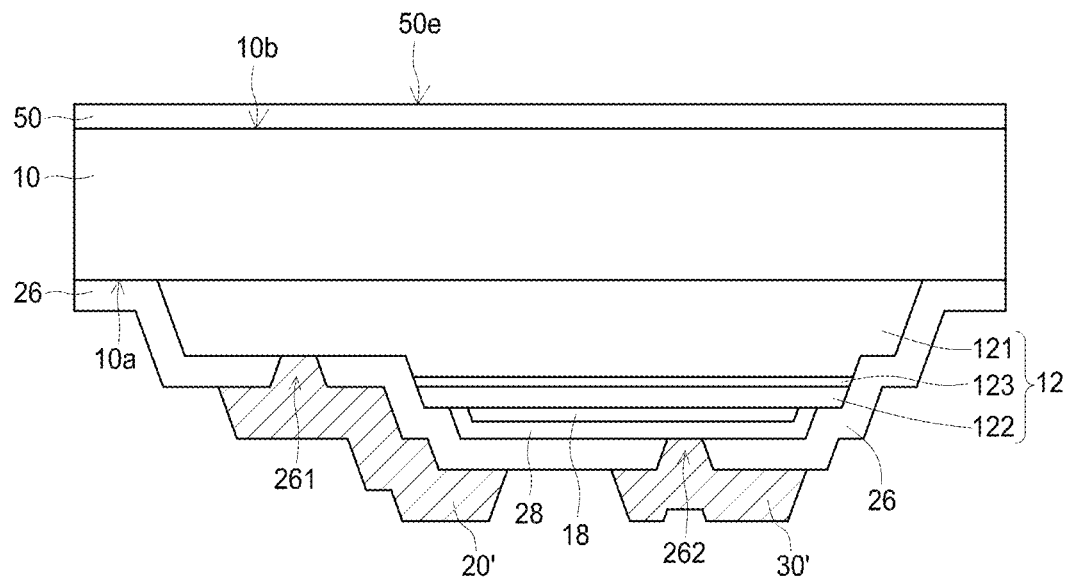
FIG. 5 shows a light-emitting device 3 in accordance with a third embodiment of the present application.

FIG. 5 shows a cross-sectional view of a light-emitting device 3 in accordance with a third embodiment of the present application. Different from the light-emitting device 1 and the light-emitting device 2, the light-emitting device 3 is a flip-chip device, and the first electrode 20' and the second electrode 30' of the light-emitting device 3 are connected to a carrier (not shown in the figure) by flip-chip bonding. The light-emitting device 3 is electrically connected to the circuit (not shown in the figure) on the carrier to be coupled with other electronic components or a power supply. In addition, unlike the light-emitting device 1 and the light-emitting device 2, the filter 50 of the light-emitting device 3 is formed on the semiconductor stack 12 and is located on the second surface 10b of the substrate 10. In one embodiment, the filter 50 contacts the second surface 10b of the substrate 10. The function, structure and material of the filter 50 are the same as described in the above embodiments, and not repeated here. The light extraction surface is the surface 50e of the filter 50 away from the semiconductor stack 12.

The light emitting device 3 includes a reflective structure 28 covering the transparent conductive layer 18. The reflective structure 28 includes a metal reflective layer, for example, a single metal layer or a laminated stack formed by multiple metal layers. In one embodiment, the reflective structure 28 includes a barrier layer (not shown) and a reflective layer (not shown). The barrier layer is formed on and covers the reflective layer. The barrier layer can prevent the migration, diffusion or oxidation of the metal elements in the reflective layer. The material of the reflective layer includes a metal with high reflectivity for the light emitted by the semiconductor stack 12, such as Ag, Au, Al, Ti, Cr, Cu, Ni, Pt, Ru, or an alloy or a laminated stack of the above materials. The material of the barrier layer includes Cr, Pt, Ti, W, Zn, or an alloy or a laminated stack of the above materials. The light emitted from the semiconductor stack 12 can be reflected by the reflective structure 28 and then be extracted from the upper surface (that is, the surface where the filter 50 is located) of the light-emitting device 3 so that the brightness of the light-emitting device 3 can be improved.

The light emitting device 3 includes a protective layer 26 covering the semiconductor stack 12 and the side surfaces of the semiconductor stack 12. In one embodiment, the protective layer 26 can further cover the first surface 10a of the substrate 10. The protection layer 26 includes openings 261 and 262 to expose the first semiconductor layer 121 and the reflective structure 28, respectively. The protective layer 26 can be non-conductive material, including organic materials or inorganic material. The organic material includes Sub, benzocyclobutene (BCB), perfluorocyclobutane (PFCB), epoxy, acrylic, ring Olefin polymer (COC), polymethyl methacrylate (PMMA), polyethylene terephthalate (PET), polycarbonate (PC), polyetherimide (Polyetherimide) or fluorocarbon polymer (Fluorocarbon Polymer). The inorganic material includes silicon, glass or dielectric materials, such as silicon oxide ($SiO_x$), silicon nitride ($SiN_x$), silicon oxynitride ($SiO_xN_y$), niobium oxide ($Nb_2O_5$), hafnium oxide ($HfO_2$), titanium oxide ($TiO_x$), magnesium fluoride ($MgF_2$), aluminum oxide ($Al_2O_3$). In one embodiment, the protective layer 26 is formed by alternately stacking a pair or a plurality of pairs of layers with different refractive indexes. By selecting materials with different refractive indexes and the thicknesses thereof, the protective layer 26 forms a reflective structure such as a distributed Bragg reflector. In the embodiment, the protective layer 26 acts as a reflective structure so the light emitted by the semiconductor stack 12 can be reflected by the protective layer 26 and then be extracted from the upper surface (that is, the surface where the filterer 50 is located) of the light-emitting device 3. Therefore the brightness of the light-emitting device 3 is improved.

In one embodiment, if the protective layer 26 forms a reflective structure, the reflective structure 28 can be omitted.

The first electrode 20' is electrically connected to the first semiconductor layer 121 through the opening 261. The second electrode 30' is electrically connected to the reflective structure 28, the transparent conductive layer 18, and the second semiconductor layer 122 through the opening 262. The first electrode 20' and the second electrode 30' include metal materials, such as Cr, Ti, W, Au, Al, In, Sn, Ni, Rh, Pt, or an alloy or a laminated stack of the above materials. The first electrode 20' and the second electrode 30' can be composed of a single layer or multiple layers. For example, the first electrode 20' and the second electrode 30' may include Ti/Au, Ti/Pt/Au, Cr/Au, Cr/Pt/Au, Ni/Au, Ni/Pt/Au, Cr/Al/Cr/Ni/Au, etc.

In another embodiment, similar to the light-emitting device 2, the light-emitting device 3 includes a plurality of light-emitting units formed on the substrate 10. An insulating layer is formed between adjacent light-emitting units, and the plurality of light-emitting units is electrically connected by the connecting electrodes. Then, the protective layer 26, the first electrode 20' and the second electrode 30' are formed.

The light emitted by the semiconductor stack 12 of the light-emitting device 3, which is defined as the first light, passes through the substrate 10 and is filtered by the filter 50 to obtain a second light. The second light is extracted from the upper surface (i.e., the surface where the filter 50 is located) of the light-emitting device 3. The second light has the same color as the first light and has a FWHM smaller than that of the first light. In this way, the color purity of the light emitted by the light-emitting device 3 can be improved. In one embodiment, the second light is a green light, and the FWHM of the second light is less than or equal to 25 nm. Preferably, the FWHM of the second light is less than or equal to 20 nm.

Figure 6:
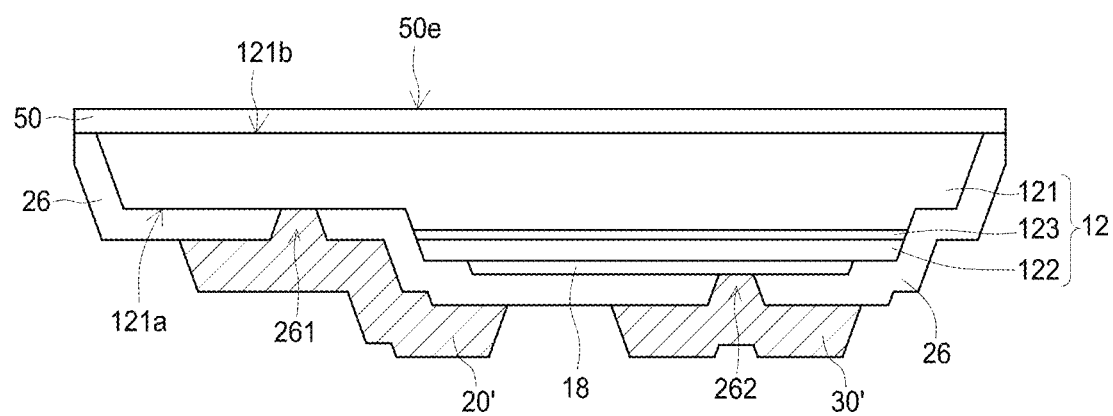
FIG. 6 shows a light-emitting device 4 in accordance with a fourth embodiment of the present application.

FIG. 6 shows a cross-sectional view of a light-emitting device 4 in accordance with a fourth embodiment of the present application. The light-emitting device 4 is similar to the light-emitting device 3, the differences are that the light-emitting device 4 is devoid of the substrate 10 and the filter 50 of the light-emitting device 4 is located on the second surface 121b of the first semiconductor layer 121, wherein the second surface 121b is opposite to the first surface 121a. The function, structure and material of the filter 50 are the same as described in the above embodiment, and not repeated here. The light extraction surface is the surface 50e of the filter 50 away from the semiconductor stack 12. The light emitted by the semiconductor stack 12 of the light-emitting device 4, which is defined as the first light, is filtered by the filter 50 to obtain a second light. The second light is extracted from the upper surface (i.e., the surface where the filter 50 is located) of the light-emitting device 4. The second light has the same color as the first light and has a FWHM smaller than that of the first light. In this way, the color purity of the light emitted by the light-emitting device 4 can be improved. In one embodiment, the second light is a green light, and the FWHM of the second light is less than or equal to 25 nm. Preferably, the FWHM of the second light is less than or equal to 20 nm.

Figure 7A:
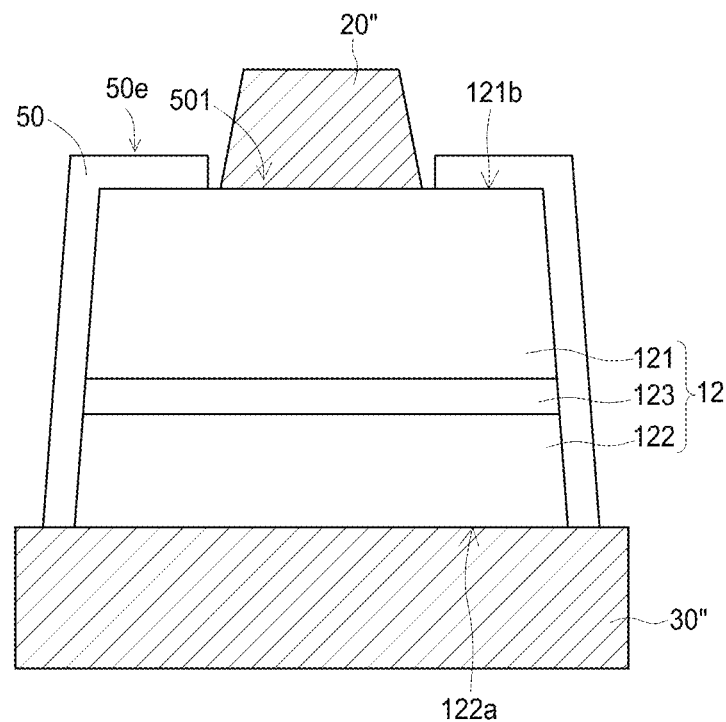
FIG. 7A and FIG. 7B show a light-emitting device 5 in accordance with a fifth embodiment of the present application.
Figure 7B:
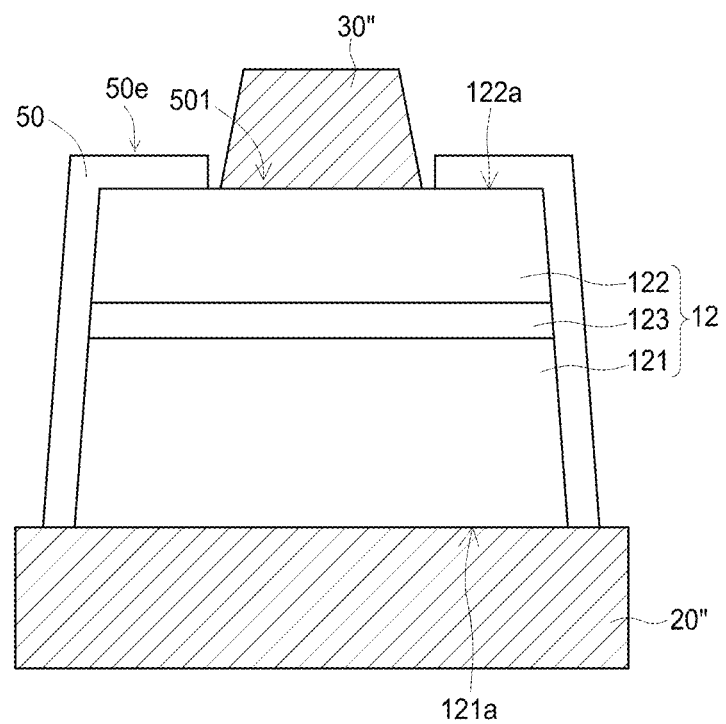

FIG. 7A shows a cross-sectional view of a light-emitting device 5 in accordance with a fifth embodiment of the present application. The light-emitting device 5 includes a first electrode 20" and a second electrode 30" respectively disposed on two opposite surfaces 121b and 122a of the semiconductor stack 12, and electrically connected to the first semiconductor layer 121 and the second semiconductor layer 122, respectively. The filter 50 covers the side surfaces of the semiconductor stack 12 and the second surface 121b of the first semiconductor layer and includes an opening 501 exposing the first electrode 20". In another embodiment (not shown), the filter 50 further covers the side surfaces of the first electrode 20", and the opening 501 exposes the upper surface of the first electrode 20". In another embodiment, the first electrode 20" is located in the opening 501 and covers a portion of the surface 50e of the filter 50. In one embodiment, the light-emitting device 5 further includes a conductive adhesive layer and/or a conductive substrate (not shown) located between the second semiconductor layer 122 and the second electrode 30". The semiconductor stack 12 is joined to the conductive substrate by the conductive adhesive layer. In another embodiment shown in FIG. 7B, the order of the semiconductor stack 12 is opposite to that of FIG. 7A. The filter 50 covers the side surface of the semiconductor stack 12 and the surface 122a of the second semiconductor layer 122 and includes an opening 501 exposing the second electrode 30". The light emitted by the semiconductor stack 12 of the light-emitting device 5, which is defined as the first light, is filtered by the filter 50 to obtain the second light. The second light is extracted from the upper surface and the side surfaces (i.e., the surfaces where the filter 50 is located) of the light-emitting device 5. The second light has the same color as the first light and has a FWHM smaller than that of the first light. In this way, the color purity of the light emitted by the light-emitting device 5 can be improved. In one embodiment, the second light is a green light, and the FWHM of the second light is less than or equal to 25 nm. Preferably, the FWHM of the second light is less than or equal to 20 nm.

In another embodiment (not shown), the filter 50 covers the surface 121b or 122a of the semiconductor stack 12, and does not cover the side surface of the semiconductor stack 12. When measuring the light-emitting device, in order to avoid the interference of a portion of the light not filtered by the filter 50 such as those extracted from the side surfaces of the light-emitting device not covered by the filter 50, the light-emitting device can be placed in a measurement equipment with a tube housing and then the second light extracted from the filter 50 can be collected.

In the present technical field, the wavelength of the peak of the spectral emission curve of the light-emitting device is defined as the peak wavelength. Dominant wavelength and chromaticity coordinates can be used to specify color characteristics of the light-emitting device, especially for the light-emitting device with visible light. People skilled in the present technical field can understand that lights having the same peak wavelength do not necessarily have the same dominant wavelength, that is, lights having the same peak wavelength do not necessarily have the same color characteristics. While the dominant wavelength of a visible light is closer to the peak wavelength thereof, the higher the color purity of the visible light is. Compared with conventional art, the light-emitting device in accordance with the embodiments of the present application has the dominant wavelength close to the peak wavelength. For example, the difference between the dominant wavelength and the peak wavelength of the light-emitting device in accordance with the embodiments of the present application is less than 3 nm, and preferably, less than 2 nm.

Figure 8A:
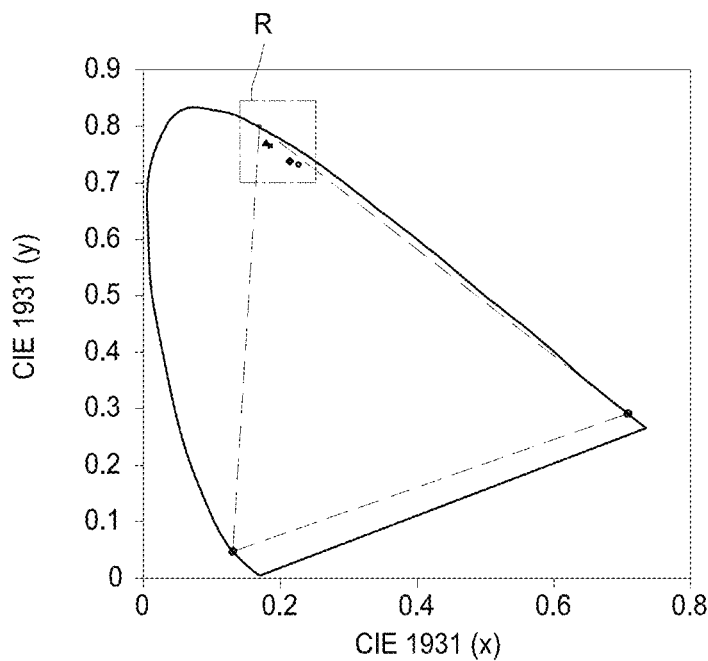
FIGS. 8A and 8B show experiment results of the light-emitting device 3 in accordance with the third embodiment and a light-emitting device of a reference example.
Figure 8B:
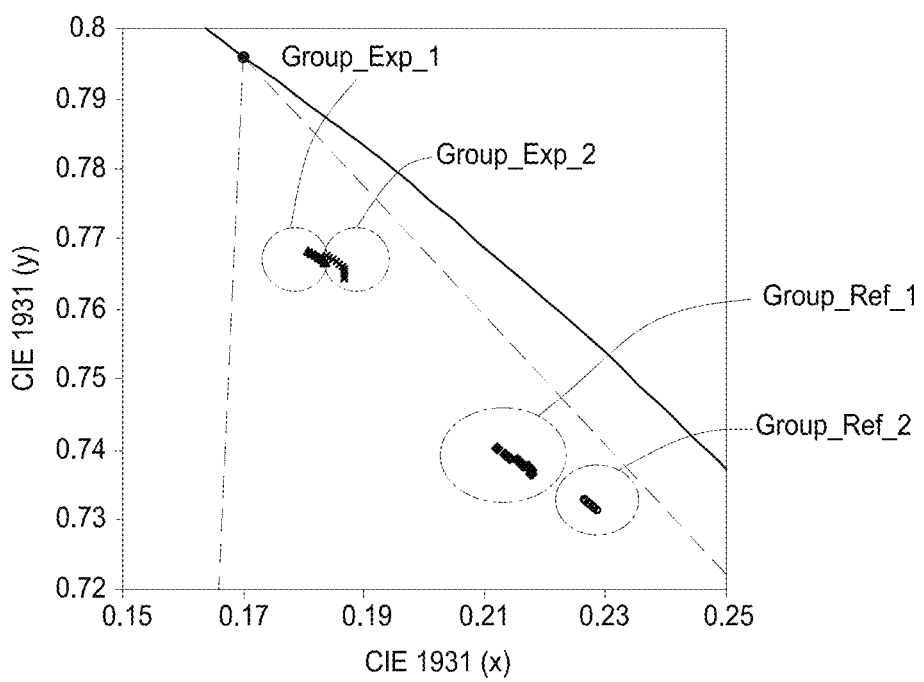

Table 1, FIG. 8A and FIG. 8B show experimental comparisons between the light-emitting device 3 in accordance with the third embodiment of the present application and a light-emitting device of a reference example. The difference between the light-emitting device 3 and the light-emitting device of the reference example is that the light-emitting device of the reference example is devoid of the filter 50.

TABLE 1

| Item | Dominant wavelength (nm) | Peak wavelength (nm) | FWHM (nm) |
|---|---|---|---|
| Reference example | 536.41 | 527.78 | 26.58 |
| The Third Embodiment (Light-emitting device 3) | 530.60 | 528.14 | 21.98 |

In the present experiment, the filter 50 includes the structure which is identical with that described in the simulated experiment result in FIG. 3. As shown in Table 1, the light-emitting device of the reference example and the light-emitting device 3 both emit green light and have similar peak wavelengths. However, compared with the reference example, the light-emitting device 3 has smaller FWHM. In addition, the difference between the dominant wavelength and the peak wavelength of the light-emitting device 3 is 2.46 nm, which is smaller than that of the light-emitting device of the reference example. In other words, the light emitted by the light-emitting device 3 has a higher color purity compared with the reference example.

FIG. 8A shows the BT.2020 (also known as Rec. 2020) color space and the plots of the measured values of the light-emitting device of the reference example and the light-emitting device 3 on the CIE chromaticity coordinate system. In FIGS. 8A and 8B, the measurement equipment with a tube housing is used to collect the lights from the light-emitting device of the reference example and the light-emitting device 3. FIG. 8B shows a partially enlarged view of the area R in FIG. 8A. Referring to FIG. 8A, defined by BT.2020, the red primary, the green primary and the blue primary fall at (0.708, 0.292), (0.17, 0.797) and (0.131, 0.046), respectively. Compared with the reference example, the light-emitting device in accordance with the embodiments of the present application has high color purity; that is, the color measured from the light-emitting device in accordance with the embodiments of the present application falls on the chromaticity coordinate closer to the RGB primaries. In general, if the measured value of a light-emitting device is near the boundary of the color gamut on the chromaticity coordinates, the light-emitting device has high color purity. Color purity can be represented as a percentage. Color purity is basically a ratio of the distance from the energy white point to the plotted point vs the distance from the energy white point to the boundary for that plot. In one embodiment with a green light-emitting device having a peak wavelength between 525 nm and 535 nm, the green light has a CIE 1931 chromaticity coordinate (X1, Y1), and where X1≤0.2, Y1≥0.75. Referring to FIG. 8B, Group_Ref_1 shows the plotted points of the light-emitting device of the reference example which peak wavelength is 530 nm and Group_Ref_2 shows the plotted points of the light-emitting device of the reference example which peak wavelength is 532 nm. Group_Exp_1 shows the plotted points of the light-emitting device 3 which peak wavelength is 530 nm and Group_Exp_2 shows the plotted points of the light-emitting device 3 which peak wavelength is 532 nm. Compared with the light-emitting device of the reference example with the same peak wavelength, the green light emitted by the light-emitting device 3 in accordance with the third embodiment is closer to the green primary coordinates (0.17, 0.797), and has higher color purity. In one embodiment with the green light-emitting device having a peak wavelength between 525 nm and 535 nm, the color purity is greater than or equal to 92%; preferably, greater than or equal to 93%.

Figure 9:
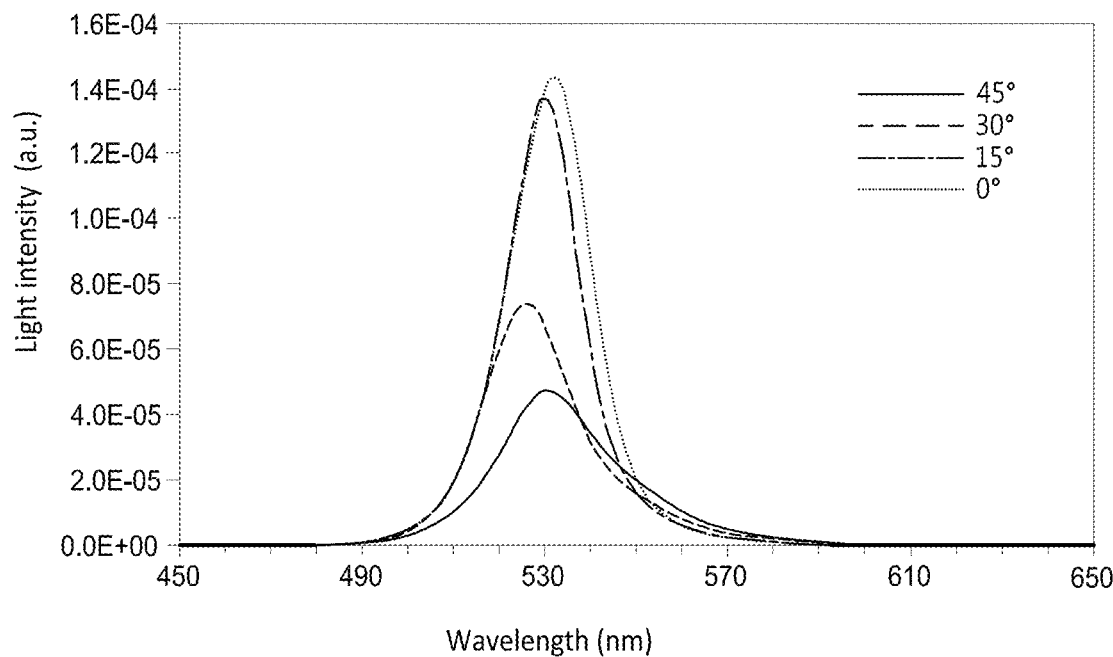
FIG. 9 shows measured wavelengths and intensities respect to different direction of the light-emitting device 3 in accordance with the third embodiment.

FIG. 9 shows measured wavelengths and intensities respect to different direction of the light-emitting device 3 in accordance with the third embodiment. In the present experiment, as described above, the filter 50 is located on the second surface 10b of the substrate 10 of the light-emitting device 3. The light emitted by the light-emitting device 3 includes a front side part and a lateral side part. The intensity of the front side part of the light is greater than that of the lateral side part and the FWHM of the front side part of the light is smaller than that of the lateral side part. The light emitted by the light-emitting device 3 includes a first directional part, which includes the portion of the light emitted from the lateral side and has a first FWHM and a first intensity. The light emitted by the light-emitting device 3 further includes a second directional part, which includes the portion of the light emitted from the front side and has a second FWHM and a second intensity. In one embodiment, the filter 50 is formed on the second surface 10b of the substrate 10, and the side surface between the second surface 10b and the first surface 10a of the substrate 10 is not covered by the filter 50. The angle formed by the first direction and the normal direction of the light extraction surface ranges from 45 to 90 degrees. The first directional part of the light includes the light escaped from the lateral side of the light-emitting device 3, such as from the side surface of the substrate 10 that not covered by the filer 50. The angle formed by the second direction and the normal direction of the light extraction surface ranges from 0 to 30 degrees. The second directional part of the light includes the light escaped from the front side of the light-emitting device 3. In the present experiment, compared with the first directional part of the light, the second FWHM of the second directional part of the light is smaller than the first FWHM of the first directional part of the light and less than or equal to 25 nm, and the second intensity is greater than the first intensity. The light extraction surface is the surface 50e of the filter 50 away from the semiconductor stack 12. The light-emitting device 3 in the present experiment emits green light. However, in accordance with the embodiments of the present application, the semiconductor stack 12 of the light-emitting device can generate red, yellow, blue, or cyan light, and the filter 50 can be designed in accordance with the above colors to obtain purified red light, yellow light, blue light or cyan light. The filter 50 improves the color purity of the light emitted by the light-emitting device, such as the color purity of the light on the front side of the light-emitting device, which is more advantageously applicable to some specific applications. For example, applying the light-emitting device in accordance with the embodiments of the present application to a display device can achieve improved color saturation, contrast and color gamut.

The light escaped from the front side of the light-emitting device is extracted from the filter 50, and the light generated by the semiconductor stack 12 is purified by the filter 50. In one embodiment, the light escaped from the lateral side of the light-emitting device which includes a portion of the light not filtered by the filter 50 has characteristics similar to the light generated by the semiconductor laminate 12. For example, the first directional part of the light has a FWHM close to the FWHM of the light generated by the semiconductor stack 12. In another embodiment, a functional element can be further formed on the lateral side of the light-emitting device. The functional element can reduce or change direction of the light escaped from the lateral side which may affect the color purification. In one embodiment, the functional element includes a reflector which can reflect or change the direction of the light so that the light generated by the semiconductor stack toward the lateral side can be reflected to escape from the front side. In another embodiment, the functional element includes a light absorber which absorbs the light generated by the semiconductor stack toward the lateral side. In another embodiment, the functional element includes a filter which has similar function of the filter 50 that permits the light of within a specified wavelength range to pass through. In another embodiment, the functional element includes a light blocking layer to block light from being extracted from the lateral side of the light-emitting device. In one embodiment, the functional element can be applied to light-emitting package or light-emitting module. For example, a functional element is provided on the side surface of the light-emitting device in the light-emitting package, and the structure of the light-emitting package will be described in detail later.

Figure 10A:
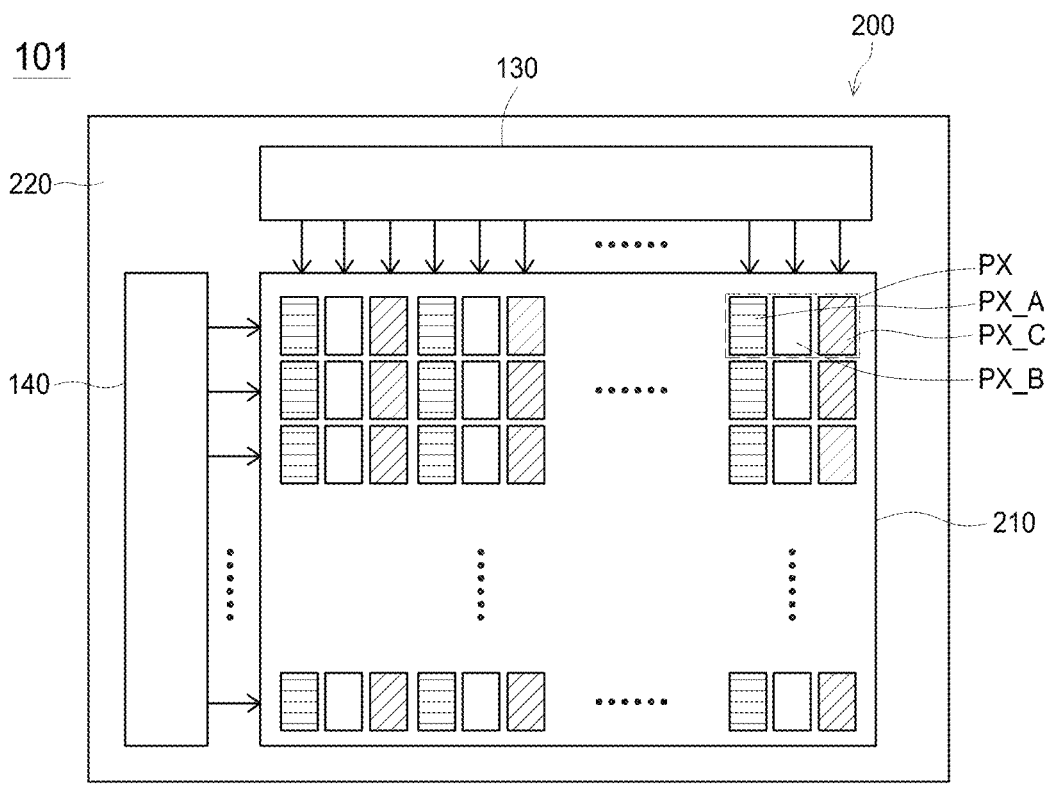
FIG. 10A shows a top view of a display device including the light-emitting devices in accordance with the embodiments of the present application.

FIG. 10A shows a top view of a display device 101 comprising the light-emitting device in accordance with the embodiments of the present application. As shown in FIG. 10A, the display device 101 includes a display panel 200 wherein the display panel 200 includes a display area 210 and a non-display area 220, and a plurality of pixel units PX are arranged in the display area 210. Each of the pixel unit PX includes a first sub-pixel PX_A, a second sub-pixel PX_B, and a third sub-pixel PX_C. A data driver 130 and a scanning driver 140 are provided in the non-display area 220. The data driver 130 is connected to a data line (not shown) of each pixel unit PX to transmit a data signal to each pixel unit PX. The scanning driver 140 is connected to a scanning line (not shown) of each pixel unit PX to transmit a scanning signal to each pixel unit PX. The pixel unit PX includes the light-emitting device in accordance with the above embodiments of the present application, which includes the filter 50 with the surface 50e away from the semiconductor stack 12 as a light extraction surface. In one embodiment, in order to realize high resolution, the display device 101 includes the plurality of small-size pixel units PX or the plurality of pixel units PX arranged in fine pitch. Therefore, the light-emitting device in the pixel unit PX has a diagonal length smaller than 300 μm.

The sub-pixels emit lights of different colors. In one embodiment, the first sub-pixel PX_A, the second sub-pixel PX_B, and the third sub-pixel PX_C are, for example, a red sub-pixel, a green sub-pixel, and a blue sub-pixel, respectively. The light-emitting devices emitting lights of different wavelengths are different sub-pixels so that the sub-pixels display different colors. The combination of red, green, and blue light generated by each sub-pixel allows the display device 101 to display a full-color image. Referring FIG. 8A, when the light emitted from the light-emitting device in each sub-pixel is closer to the coordinate of the primary color defined by the color range standard, the wider the color gamut that the pixel can display. Therefore, wide color gamut display device can be realized. In conventional display devices, in order to achieve high color saturation, high contrast, or wide color gamut, a filter element or wavelength conversion element is provided on the pixel in addition to the light-emitting device, which may increase process complexity, production cost and structural complexity of the display device. In addition, the filter elements or wavelength conversion elements may cause brightness loss or intensity loss in the light-emitting device. The display device including the light-emitting device in accordance with the embodiments of the present application can achieve high color saturation, high contrast, or wide color gamut without additional filter elements or wavelength conversion elements.

However, the number and arrangement of the sub-pixels in the pixel unit PX in the present embodiment are not limited to this, and different modes can be implemented according to user's requirements such as color saturation, resolution, and contrast. In accordance with another embodiment, the pixel unit PX further includes a fourth sub-pixel, and the fourth sub-pixel includes the light-emitting device in accordance with any of the above embodiments of the present application. The wavelength of the light-emitting device in the fourth sub-pixel is different from that of the light-emitting devices in the first to third sub-pixels. For example, the fourth sub-pixel is a cyan sub-pixel, and the light-emitting device in the fourth sub-pixel has a peak wavelength ranged between 495 nm and 520 nm. In one embodiment, the peak wavelength of the light-emitting device in the fourth sub-pixel is between 500 nm and 510 nm. Similarly, the light-emitting device in the fourth sub-pixel includes the filter 50 to purify the cyan light emitted by the semiconductor stack 12 so that a higher-color-purity cyan sub-pixel can be obtained and the color performance of the display device is improved.

Figure 10B:
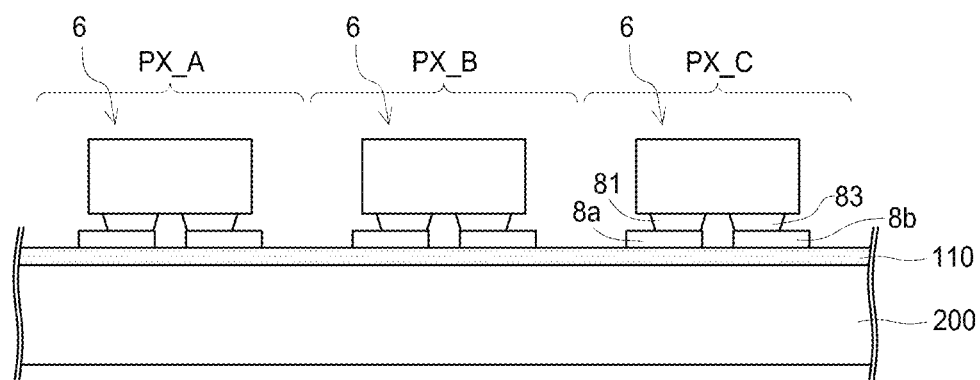
FIG. 10B shows a cross-sectional view of a pixel unit in accordance with an embodiment the present application.

FIG. 10B shows a cross-sectional view of the pixel unit PX in FIG. 10A. The light-emitting device 3 in the third embodiment or the light-emitting device 4 in the fourth embodiment is encapsulated in a light-emitting package 6 and the light-emitting package 6 constitutes any one of the sub-pixels. The light-emitting package 6 is bonded to the display panel 200 in a flip-chip form. A circuit layer 110 and bonding pads 8a and 8b are located on the display panel 200. The circuit layer 110 is electrically connected to the bonding pads 8a and 8b. In on embodiment, the circuit layer 110 includes active components, such as transistors. The electrodes 81 and 83 of the light-emitting package 6 are bonded to the bonding pads 8a and 8b by, for example, soldering, and are electrically connected to the driving circuit (i.e., the data driver 130 and the scanning driver 140) through the circuit layer 110. In this way, the data driver 130, the scanning driver 140, and the circuit layer 110 control the light-emitting devices in the pixel unit PX.

Figure 10C:
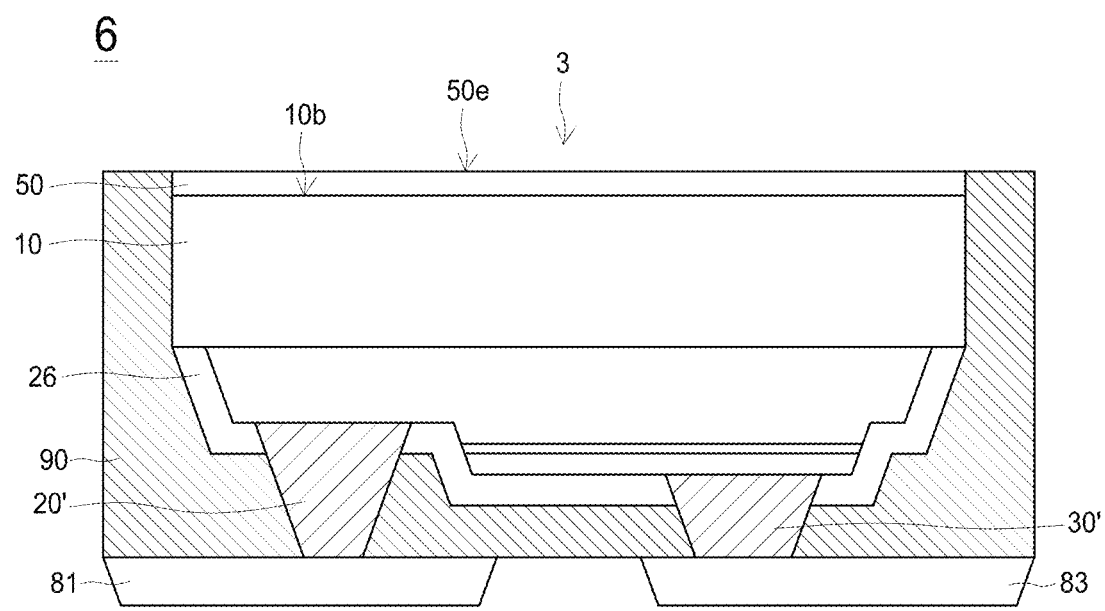
FIG. 10C shows a cross-sectional view of a light-emitting package in accordance with an embodiment the present application.

FIG. 10C shows the light-emitting package 6 in accordance with one embodiment of the present application and the light-emitting package 6 includes the light-emitting device 3 disclosed in the third embodiment. The light-emitting package 6 includes an encapsulated material 90 covering the side surface of the light-emitting device 3. In one embodiment, the encapsulated material 90 includes a base material, such as silicone, epoxy, acrylic, or a mixture thereof. In another embodiment, the encapsulated material 90 includes the base material and other materials to form the aforementioned functional element. For example, the encapsulated material 90 includes the base material and a light-absorbing material to form a light absorber. The light-absorbing material includes a black material, such as carbon black. For example, the encapsulated material 90 includes the base material and a reflective material to form a reflector, where the reflective material includes titanium oxide ($TiO_x$), silicon oxide ($SiO_x$) or a mixture thereof. In another embodiment, the encapsulated material 90 includes multiple functional elements with different functions. For example, the encapsulated material 90 includes the reflector covering the light-emitting device and the light absorber covering the reflector.

In another embodiment (not shown), the pixel unit PX includes the light-emitting package 6, and single light-emitting package 6 includes a plurality of light-emitting devices. Each light-emitting device constitutes one sub-pixel. In one embodiment, the encapsulated material 90 of the light-emitting package 6 forms the functional element and is filled between the plurality of light-emitting devices. FIG. 10B shows that the light-emitting package 6 includes the flip-chip light-emitting device in accordance with the embodiment of the present application, however, the light-emitting package of the present application is not limited to this. In other embodiments (not shown), any one of the sub-pixel includes the light-emitting device in accordance with any embodiment of the present application. The first electrode 20 (20' or 20") and the second electrode 30 (30' or 30") of the light-emitting device are electrically connected to the bonding pads 8a and 8b on the display panel 200 by different methods which are suitable for the light-emitting devices in different embodiments, such as wire bonding, soldering bonding or die-bonding.

Figure 11:
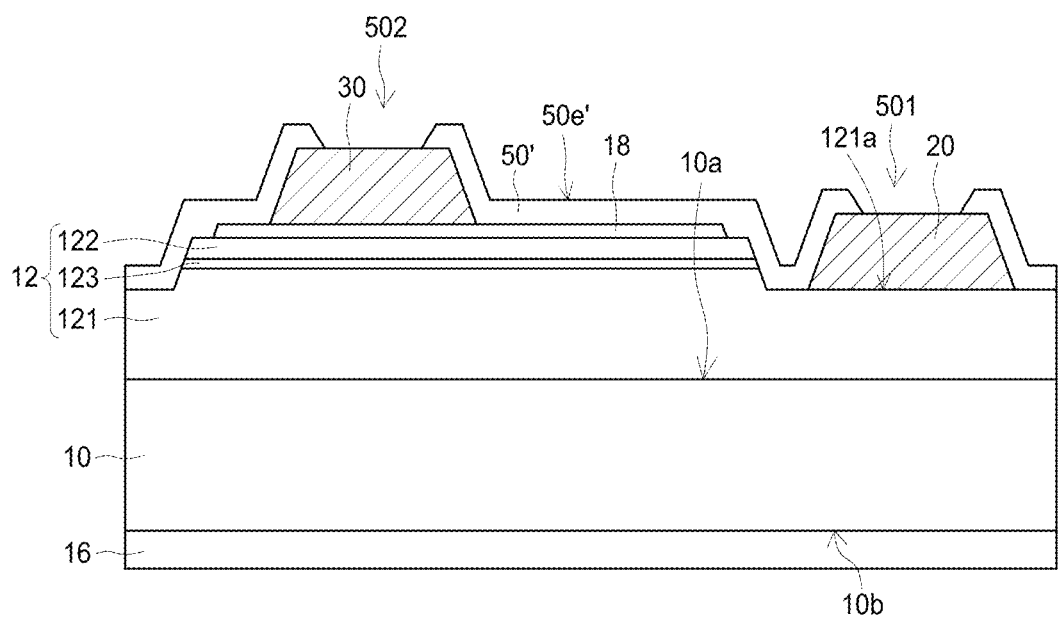
FIG. 11 shows a light-emitting device 9 in accordance with a sixth embodiment of the present application.

FIG. 11 shows a cross-sectional view of a light-emitting device 9 in accordance with a sixth embodiment of the present application. The light-emitting device 9 in FIG. 11 applies the structure similar with the light-emitting device 1 shown in FIG. 1 as an example. The difference between the two is the filter layer 50'. However, the structure of the light-emitting device 9 can be the same as any of the light-emitting devices in the above embodiments. The light-emitting device 9 includes the filter 50' which is formed by alternately stacking a pair or a plurality of pairs of layers with different refractive indexes. The filter 50' has a similar structure to the aforementioned filter 50. By selecting dielectric materials with different refractive indexes and different thicknesses as the first sublayer and the second sublayer (not shown) in the filter 50', the light generated from the semiconductor stack 12 can be selectively transmitted through the filter 50' or reflected by the filter 50'. Being different from the filter 50, the filter 50' filters the light within a pre-defined range of incident angle. That is, only the light within the pre-defined incident angle can pass through the filter 50'. Specifically, in the light-emitting device 9 shown in FIG. 11, the semiconductor stack 12 emits a light with a specific peak wavelength and irradiates on the filter 50'. Most of the light within a small incident angle passes through the filter 50' and most of the light within a large incident angle is reflected by the filter 50'. In another embodiment, the structure of the light-emitting device 9 is similar to that of the light-emitting device 3 in the third embodiment. The light generated from the semiconductor stack 12 passes through the substrate 10 and irradiates on the filter 50'. Then, most of the light within a small incident angle passes through the filter 50' and most of the light within a large incident angle is reflected by the filter 50'.

Figure 12:
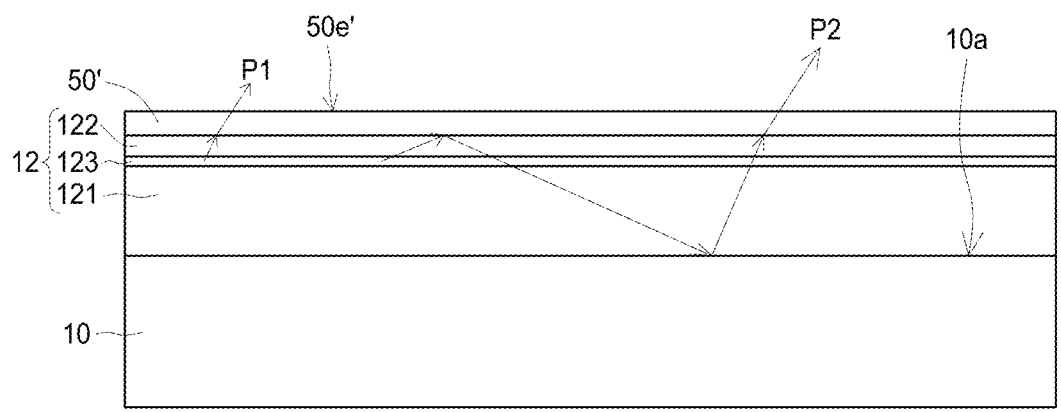
FIG. 12 shows schematic light paths of the light-emitting device 9.

The incident angle means the angle between the direction of the light and the normal direction of the incident surface. In one embodiment, FIG. 12 shows a schematic diagram of the light path of the light-emitting device 9. The light path of the small-angle incident light is shown as P1. The light generated from the active region 123 passes through the filter 50' and escapes from the surface 50e' of the filter 50'. The light path of the large-angle incident light is shown as P2. The light generated from the active region 123 is reflected at the interface between the semiconductor stack 12 and the filter 50', and then turns toward the substrate 10 and is refracted and/or scattered by the patterned structure (not shown) on the first surface 10a of the substrate 10. Therefore, the direction of the large-angle incident light is changed and turns into a small-angle incident light at the interface between the semiconductor stack 12 and the filter 50', which escapes from the surface 50e' of the filter 50e'. In this way, the light converges due to the filter 50' of the light-emitting device 9 so that the beam angle of the light-emitting device 9 can be narrowed.

The light emitted by the light-emitting device 9 includes a front side part and a lateral side part, wherein the intensity of the front side part of the light is greater than that of the lateral side part of the light. In one embodiment, the light transmittance of the filter 50' is greater than 90% for the light with an incident angle less than 10 degrees. The light transmittance of the filter 50' is lower than 10% for the light with an incident angle greater than 20 degrees. In accordance with the sixth embodiment of the present application, the beam angle of the light-emitting device 9 is less than or equal to 120 degrees. In another embodiment, the beam angle of the light-emitting device 9 is less than or equal to 110 degrees. In another embodiment, the beam angle the light-emitting device 9 is between 50 degrees and 110 degrees. In another embodiment, the beam angle of the light-emitting device 9 is between 50 degrees and 100 degrees. Beam angle means the range of angles in which luminous intensity of half or more the luminous intensity measured at a normal direction is exhibited in a light distribution curve in polar chart of a light-emitting device.

Figure 13:
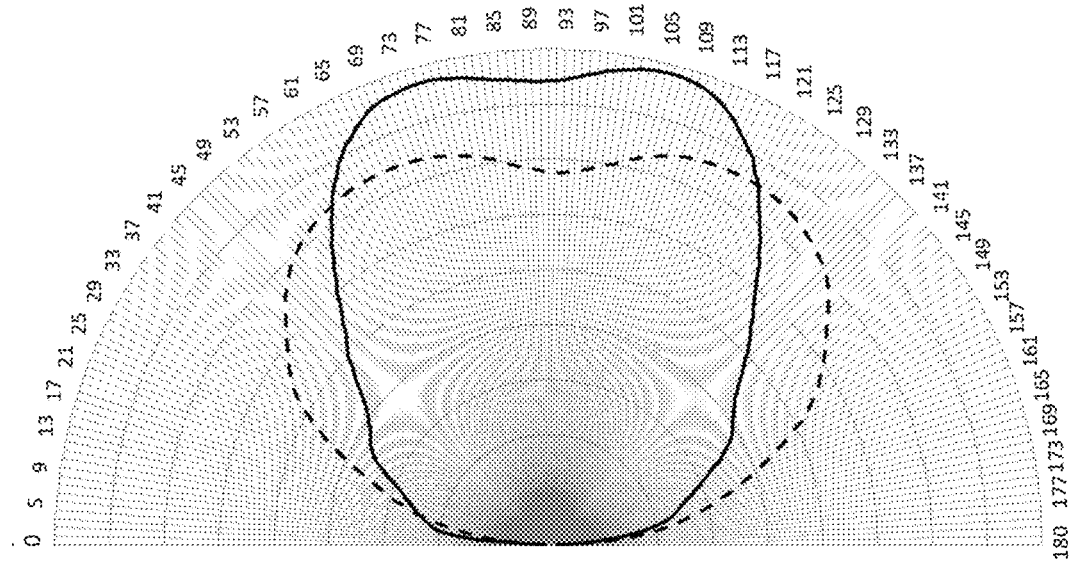
FIG. 13 shows light distribution curves of the light-emitting device 9 and a light-emitting device of a reference example.

FIG. 13 shows spatial light distributions of the light-emitting device 9 and a light-emitting device according to a reference example. The structure of the light-emitting device 9 of the sixth embodiment is similar to that of the light-emitting device 1. The filters 50 and 50' are formed by alternately stacking the first sub-layer and the second sub-layer with different refractive indexes. The filter 50' is similar to the filter 50 and light can be selectively reflected by the filter and selectively pass through the filters. The structure of the light-emitting device of the reference example is similar to that of light-emitting device 9, except that the light-emitting device of the reference example is devoid of the filter 50'. The refractive indexes and thicknesses of the first sub-layer and the second sub-layer in the filter 50 are designed to allow light within a specified wavelength range to pass through and so that is can filter the light. The incident light with small incident angle has a higher intensity than that with large incident angle. On the other hand, the refractive indexes and thicknesses of the first sub-layer and the second sub-layer in the filter 50' are designed to allow light within a specified incident angle to pass through. The incident light with small incident angle has a higher intensity than that with large incident angle. In one embodiment, the filter 50' has a transmittance of more than 90% for the light with an incident angle less than 10 degrees, and has a transmittance of less than 10% (or a reflectivity of more than 80%) for the light with an incident angle greater than 20 degrees.

The filter 50' includes a plurality of pairs of dielectric layers composed of $SiO_2$ and $TiO_2$, including three groups of the dielectric pairs. The first group of the dielectric pairs is closer to the semiconductor stack 12 and the second group of the dielectric pairs is farther away from the semiconductor stack 12. The third group of the dielectric pairs is between the first group of the dielectric pairs and the second group of the dielectric pairs. The optical thicknesses of the $SiO_2$ and $TiO_2$ layers of the first group are greater than the optical thicknesses of the $SiO_2$ and $TiO_2$ layers of the third group. The optical thickness of the $SiO_2$ and $TiO_2$ layers of the second group can be greater than or smaller than the optical thicknesses of the $SiO_2$ and $TiO_2$ layers of the third group. The numbers of the pairs of the first group, the second group and the third group can be integer or non-integer. The number of the dielectric pairs in the third group is larger than the number of dielectric pairs in the first group and the second group. By adjusting the thicknesses of the layers of the first group and the second group, the decrease of the transmittance within some incident angle caused by interference phenomenon can be reduced. As shown in FIG. 13, compared with the reference example, the light-emitting device 9 in accordance with the sixth embodiment has a higher intensity from 60 degrees to 120 degrees, which means that the light in the front side of the light-emitting device 9 has higher intensity. In other words, within ±30 degrees of the normal direction of the surface 50e' of the filter 50, the light-emitting device 9 of the sixth embodiment has higher intensity and can concentrate light in front side. In addition, the beam angle of the light-emitting device 9 is 101 degrees, which is smaller than 139 degrees of the beam angle of the light-emitting device of the reference example.

In another embodiment, similar to the aforementioned embodiments, the light-emitting device 9 further includes the functional element formed on the lateral side thereof. In one embodiment, the functional element includes a reflector which can reflect or change the direction of the light so that the light generated by the semiconductor stack toward the lateral side can turn to escape from the front side. In another embodiment, the functional element includes a light absorber which absorbs the light generated by the semiconductor stack toward the lateral side. In another embodiment, the functional element includes a filter which has a similar function of the filter 50' that permits the light of within a specific incident angle to pass through. In another embodiment, the functional element includes a light blocking layer to block light from being extracted from the lateral side of the light-emitting device.

Figure 14:
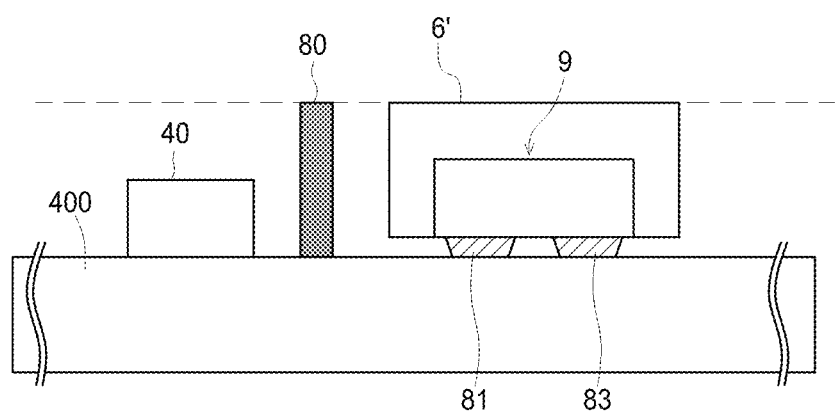
FIG. 14 shows a cross-sectional view of a sensing module including the light-emitting device in accordance with the embodiments of the present application.

FIG. 14 is a schematic diagram of a sensing module 201. As shown in FIG. 14, the sensing module 201 includes a carrier 400, a light-emitting package 6' including the light-emitting device 9 in accordance with any embodiment of the present application and a light sensing element 40 on the carrier 400. The light-emitting device 9 and the light sensing element 40 are electrically connected to a circuit (not shown) on the carrier 400. The structure of the light-emitting package 6' is similar to that of the aforementioned light-emitting package 6 and not repeated here. As an example, the light-emitting package 6' and the light-emitting device 9 shown in FIG. 14 are joined to the carrier 400 in a flip type, like the light-emitting device 3. However, the light-emitting device 9 can be fixed on the carrier 400 by different methods which are suitable for the light-emitting device in different embodiments, such as wire bonding, soldering bonding or die-bonding. The light sensing element 40 includes a photodiode. A light blocking element 80 can be further provided between the light sensing element 40 and the light emitting package 6' or the light emitting device 9 to avoid interference between the two; for example, the light sensing element 40 prevents the light emitted by the light emitting device 9 from being directly received by the light sensing element 40.

The sensing module 201 is applied to a physiological monitoring device. For example, the light emitted from the light-emitting device 9 irradiates on user's body to generate a reflection signal, and the light sensing element 40 receives the reflection signal to obtain a measurement signal. Then, the user's physiological data, such as heart rate, blood oxygen, blood pressure, blood sugar, moisture, or sweat can be obtained through calculations of a circuit. In order to measure accurate physiological information, the light emitted from the light-emitting device 9 is preferably concentrated on the user's body and reaches a specified intensity. The sensing module 201 in accordance with of one embodiment of the present application includes the light-emitting device 9 with the filter 50'. Since the filter 50' can narrow the beam angle of the light-emitting device, a concentrated light source can be obtained even without additional optical elements such as lens. In addition, the sensing module 201 without the additional optical components is more compact, which is suitable for users to wear.

In another embodiment, the light-emitting device 9 can also be applied to the display device 101 shown in FIG. 10A and the pixel unit PX shown in FIG. 10B. Since the filter 50' converges the beam angle of the light-emitting device, the beam angles of the light-emitting devices in the plurality of pixel units PX of the display device 101 can be more uniform, thereby improving the uniformity of the image of the display device 101.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
a semiconductor stack generating a first light;
a filter formed on the semiconductor stack, comprising a first surface facing the semiconductor stack and a second surface opposite to the first surface; and
a transparent conductive layer formed on the semiconductor stack;
wherein:
the filter comprises a plurality of first dielectric layers with a first refractive index and a plurality of second dielectric layers with a second refractive index alternately stacked,
a portion of the first light is transmitted by the filter and extracted from the second surface,
the light-emitting device has a beam angle in a range of 50 degrees to 110 degrees, and
the filter comprises a light transmittance of more than 90% with respect to light incident at an incident angle in a range of less than 10 degrees.

2. The light-emitting device according to claim 1, further comprising an electrode formed on and electrically connecting the semiconductor stack, wherein the filter and the electrode are disposed on opposite sides of the semiconductor stack.

3. The light-emitting device according to claim 2, further comprising a substrate located between the semiconductor stack and the filter, wherein the first surface contacts the substrate.

4. The light-emitting device according to claim 2, further comprising a reflective structure formed between the semiconductor stack and the electrode.

5. The light-emitting device according to claim 4, wherein the reflective structure comprises a metal layer electrically connected to the electrode.

6. The light-emitting device according to claim 4, wherein the reflective structure comprises non-conductive materials, wherein the reflective structure comprises an opening and the electrode is filled in the opening and electrically connected to the semiconductor stack.

7. The light-emitting device according to claim 2, wherein the first surface of the filter contacts the semiconductor stack.

8. The light-emitting device according to claim 1, further comprising:
- a substrate located under the semiconductor stack; and
- an electrode located on the semiconductor stack;
- wherein the first surface contacts the transparent conductive layer and the filter comprises an opening exposing the electrode.

9. The light-emitting device according to claim 1, wherein the light-emitting device has a diagonal length less than 300 µm.

10. The light-emitting device according to claim 1, wherein a light emitted by the light-emitting device comprises a front side part and a lateral side part, wherein an intensity of the front side part of the light is greater than that of the lateral side part of the light.

11. The light-emitting device according to claim 1, wherein the filter further comprises a bottom layer between the semiconductor stack and the pluralities of the first dielectric layers and the second dielectric layers, wherein the bottom layer comprises dielectric material and a thickness greater than those of the pluralities of the first dielectric layers and the second dielectric layers.

12. The light-emitting device according to claim 1, wherein the filter further comprises a top layer and the pluralities of the first dielectric layers and the second dielectric layers are formed between the top layer and the semiconductor stack, wherein the top layer comprises dielectric material and a thickness greater than those of the pluralities of the first dielectric layers and the second dielectric layers.

13. A display device, comprising a plurality of pixels, wherein one of the plurality of pixels comprises the light-emitting device according to claim 1.

14. A light-emitting package, comprising the light-emitting device according to claim 1 and an encapsulated material covering a side surface of the light-emitting device.

15. The light-emitting package according to claim 14, wherein the encapsulated material comprises a functional element which comprises a reflector, a light absorber, a light blocking layer or another filter.

* * * * *